United States Patent
Ji (10) Patent No.: US 11,703,527 B2
(45) Date of Patent: Jul. 18, 2023

(54) VOLTAGE DETECTION CIRCUIT AND CHARGE PUMP CIRCUIT

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 41 days.

(21) Appl. No.: 17/469,980

(22) Filed: Sep. 9, 2021

(65) Prior Publication Data

US 2022/0074978 A1 Mar. 10, 2022

Related U.S. Application Data

(63) Continuation of application No. PCT/CN2021/103598, filed on Jun. 30, 2021.

(30) Foreign Application Priority Data

Sep. 4, 2020 (CN) .......................... 202010921793.6

(51) Int. Cl.
*G01R 19/32* (2006.01)
*H02M 3/07* (2006.01)
*G11C 11/4074* (2006.01)

(52) U.S. Cl.
CPC .............. *G01R 19/32* (2013.01); *H02M 3/07* (2013.01); *G11C 11/4074* (2013.01)

(58) Field of Classification Search
CPC ................................ H02M 3/07; G01R 19/32
See application file for complete search history.

(56) References Cited

U.S. PATENT DOCUMENTS

| 5,132,556 | A | 7/1992 | Cheng |
| 9,513,318 | B2 | 12/2016 | Kiep et al. |
| 2007/0063760 | A1* | 3/2007 | Stopel .................. H02M 3/073 327/536 |
| 2011/0156804 | A1* | 6/2011 | Pelgrom ................ H02M 3/07 327/536 |
| 2013/0328620 | A1 | 12/2013 | Li |

(Continued)

FOREIGN PATENT DOCUMENTS

| CN | 1416136 A | 5/2003 |
| CN | 101930248 A | 12/2010 |

(Continued)

OTHER PUBLICATIONS

First Office Action of the Chinese application No. 202010921793.6, dated Jun. 21, 2022, 19 pgs.

(Continued)

*Primary Examiner* — Sibin Chen
(74) *Attorney, Agent, or Firm* — Cooper Legal Group, LLC (57) ABSTRACT

A voltage detection circuit and a charge pump circuit using the voltage detection circuit are provided. The voltage detection circuit includes: a voltage raising circuit configured to adjust a voltage to be measured and then output an adjusted voltage, where the adjusted voltage is equal to the sum of the voltage to be measured and a reference voltage; and the reference voltage is generated by a combination of a first voltage with a positive temperature coefficient and a second voltage with a negative temperature coefficient.

18 Claims, 5 Drawing Sheets

(56) References Cited

U.S. PATENT DOCUMENTS

| | | | |
|---|---|---|---|
| 2014/0077789 A1 | 3/2014 | Hu et al. | |
| 2015/0346245 A1* | 12/2015 | Kiep | H02M 3/158 323/284 |
| 2021/0034092 A1* | 2/2021 | Tomioka | G05F 3/185 |

FOREIGN PATENT DOCUMENTS

| | | | |
|---|---|---|---|
| CN | 102830271 | A | 12/2012 |
| CN | 103138564 | * | 6/2013 |
| CN | 103138564 | A | 6/2013 |
| CN | 103853228 | A | 6/2014 |
| CN | 204667243 | U | 9/2015 |
| CN | 204808098 | U | 11/2015 |
| CN | 105137160 | A | 12/2015 |
| CN | 106155171 | A | 11/2016 |
| CN | 106645893 | A | 5/2017 |
| CN | 106849644 | * | 6/2017 |
| CN | 106849644 | A | 6/2017 |
| CN | 107238743 | A | 10/2017 |
| CN | 107608441 | A | 1/2018 |
| CN | 107783583 | A | 3/2018 |
| CN | 108052154 | A | 5/2018 |
| CN | 108448891 | A | 8/2018 |
| CN | 109088537 | A | 12/2018 |
| CN | 110515417 | A | 11/2019 |
| CN | 110673681 | A | 1/2020 |
| CN | 111293876 | A | 6/2020 |
| CN | 111338417 | A | 6/2020 |
| CN | 111427411 | A | 7/2020 |
| JP | H11220872 | A | 8/1999 |
| JP | 2009016929 | A | 1/2009 |
| TW | 376580 | B | 12/1999 |

OTHER PUBLICATIONS

"Design of High-Order Temperature Compensation BiCOMS Bandgap Voltage Reference", Jul. 2007, Ke-Feng Zhang, Hua Xiao and Hua Wang, Telecom Power Technologies, vol. 24 No. 4, 3 pgs.

"Positive Corona Characteristics on RTV SIR Coated Glass Insulating Surface under Ramp High Voltages", Dec. 2017, N.C. Mayrikakis and P.M. Mikropoulos, 52nd International Universities Power Engineering Conference (UPEC), 6 pgs.

International Search Report in the international application No. PCT/CN2021/103598, dated Oct. 9, 2021, 3 pgs.

Third Office Action of the Chinese application No. 202010921793.6, dated Apr. 27, 2023, 12 pages.

* cited by examiner

VOLTAGE DETECTION CIRCUIT AND CHARGE PUMP CIRCUIT

CROSS-REFERENCE TO RELATED APPLICATION

This is a continuation application of International patent application No. PCT/CN2021/103598, filed on Jun. 30, 2021, which claims priority to Chinese patent application No. 202010921793.6, filed on Sep. 4, 2020 and entitled "Voltage Detection Circuit and Charge Pump Circuit". The contents of International patent application No. PCT/CN2021/103598 and Chinese patent application No. 202010921793.6 are incorporated herein by reference in their entireties.

TECHNICAL FIELD

The present disclosure relates to the technical field of electronic circuits, and exemplarily relates to a voltage detection circuit capable of improving the detection accuracy of negative voltage and a charge pump circuit using the voltage detection circuit.

BACKGROUND

In the operating processes of DRAM (Dynamic Random Access Memory) chips, a variety of charge pump circuits are used to provide a variety of power supplies for internal circuits. For example, when a WL (Word Line) is turned on, the WL needs to be pulled up to a VPP voltage (2.9V) to fully turn on an access transistor. When the WL is turned off, the WL needs to be pulled to a negative voltage VKK or Vnwl (such as −0.2V) so as to reduce the leakage current. In addition, the substrate potential of the access transistor needs to be set to a negative potential VBB (−0.7V) so as to increase the threshold voltage, so that the leakage current can be further reduced.

The charge pump circuit usually includes a charge pump core circuit and an oscillator circuit, and is equipped with a voltage detection circuit. The voltage detection circuit is configured to stop the work of the oscillator circuit and then stop the charge pump core circuit when detecting that the output voltage of the charge pump circuit reaches a preset value, and restart the oscillator to enable the charge pump to enter a pump mode when detecting that the output voltage deviates from the preset value.

When the output voltage of the charge pump circuit, that is, a voltage to be measured, is a negative voltage, in the related arts, a transistor superposition mode is usually used in the voltage detection circuit to raise the voltage to be measured, and then the raised voltage is compared with the reference voltage to realize the detection. However, due to the disturbance of the power supply voltage or the random deviation of the transistor threshold voltage, the raised voltage often generates a large deviation, which influences the detection accuracy of the voltage to be measured (negative voltage).

Therefore, there is a need for a voltage detection circuit capable of effectively improving the voltage detection accuracy, especially the negative voltage detection accuracy.

It should be noted that the information disclosed in the above background art is only used to enhance the understanding of the background of the present disclosure, and therefore may include information that does not constitute the prior art known to those of ordinary skill in the art.

SUMMARY

The present disclosure aims to provide a voltage detection circuit and a charge pump circuit using the voltage detection circuit, which are used to overcome the problem of inaccurate negative voltage detection caused by the limitations and defects of related arts at least to a certain extent.

According to a first aspect of the present disclosure, a voltage detection circuit is provided. The voltage detection circuit includes: a voltage raising circuit configured to adjust a voltage to be measured and output an adjusted voltage. The adjusted voltage is equal to the sum of the voltage to be measured and a reference voltage, and the reference voltage is generated by a combination of a first voltage with a positive temperature coefficient and a second voltage with a negative temperature coefficient.

According to a second aspect of the present disclosure, a charge pump circuit is provided. The charge pump circuit includes any one of the voltage detection circuits as described above.

It should be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the specification, serve to explain the principles of the present disclosure. It is apparent that the drawings in the following description are only some embodiments of the present disclosure. Those skilled in the art can also obtain other drawings according to these drawings without any creative work.

DETAILED DESCRIPTION

Exemplary embodiments will now be described more fully with reference to the accompanying drawings. However, the exemplary embodiments can be implemented in various forms, and should not be construed as being limited to the examples set forth herein. On the contrary, these embodiments are provided, so that the present disclosure will be more comprehensive and complete, and will fully convey the concept of the exemplary embodiments to those skilled in the art. The described features, structures or characteristics may be combined in one or more embodiments in any suitable mode. In the following description, many specific details are provided to give a sufficient understanding of the embodiments of the present disclosure. However, those skilled in the art will realize that the technical solutions of the present disclosure can be practiced while omitting one or more of the specific details, or other methods, components, devices, steps, etc. can be used. In other cases, the well-known technical solutions are not shown or described in detail so as to avoid overwhelming the crowd and obscure all aspects of the present disclosure.

In addition, the drawings are only schematic illustrations of the present disclosure, and the same reference numerals in the drawings denote the same or similar parts, and thus, the repeated descriptions will be omitted. Some of the block diagrams shown in the drawings are functional entities and do not necessarily correspond to physically or logically independent entities. These functional entities may be realized in the form of software, or these functional entities may be implemented in one or more hardware modules or integrated circuits, or these functional entities may be implemented in different networks and/or processor devices and/or microcontroller devices.

The exemplary embodiments of the present disclosure will be described in detail below with reference to the accompanying drawings.

Figure 1:
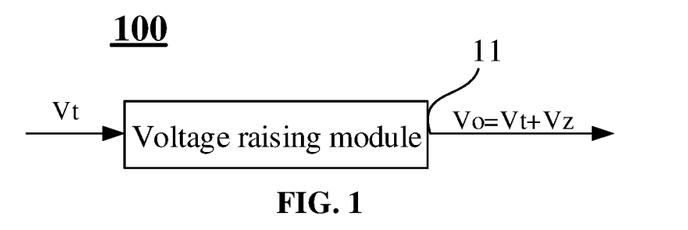
FIG. 1 is a schematic structural diagram of a voltage detection circuit in an exemplary embodiment of the present disclosure.

FIG. 1 is a schematic structural diagram of a voltage detection circuit in an exemplary embodiment of the present disclosure.

Referring to FIG. 1, a voltage detection circuit 100 may include: a voltage raising module 11.

The voltage raising module 11 is configured to adjust a voltage Vt to be measured and then output an adjusted voltage Vo. The adjusted voltage Vo is equal to the sum of the voltage Vt to be measured and a reference voltage Vz.

The reference voltage Vz is generated by a combination of a first voltage with a positive temperature coefficient and a second voltage with a negative temperature coefficient.

In an exemplary embodiment of the present disclosure, the absolute value of the positive temperature coefficient is equal to the absolute value of the negative temperature coefficient. At this time, since the reference voltage Vz is generated by a combination of the first voltage V1 and the second voltage V2, and the absolute value of the positive temperature coefficient of the first voltage V1 is equal to the absolute value of the negative temperature coefficient of the second voltage V2, the changes of the first voltage V1 and the second voltage V2 caused by the temperature influence have the same amplitude and opposite directions and thus can be cancelled out. Therefore, the influence of the temperature change on the reference voltage Vz can be avoided effectively, so that the voltage Vt to be measured is raised correctly, thereby realizing accurate measurement of the voltage Vt to be measured.

In some embodiments, the voltage Vt to be measured is a negative voltage, such as a voltage VBB or VKK used in a DRAM circuit. When the voltage Vt to be measured is VBB or VKK, the reference voltage Vz may be 1.2V.

Due to being raised by the reference voltage Vz which is not influenced by the temperature, the negative voltage may be accurately measured. In some other embodiments, the voltage Vt to be measured may also be a positive voltage, which is not particularly limited in the present disclosure.

Figure 2:
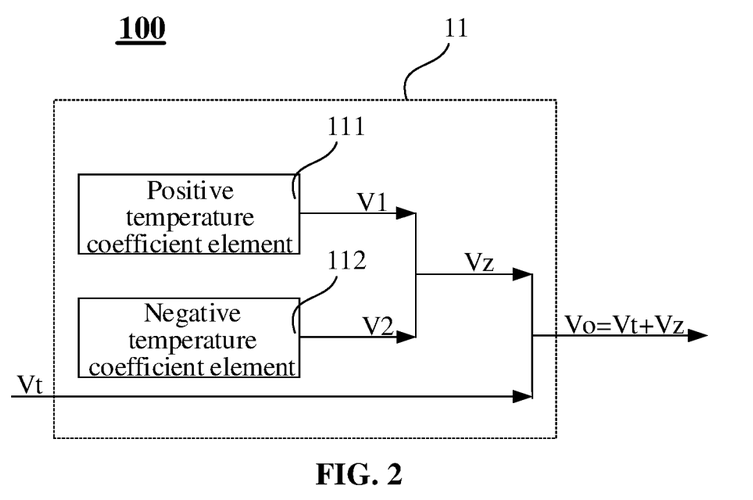
FIG. 2 is a schematic diagram of a voltage raising module in an embodiment of the present disclosure.

FIG. 2 is a schematic diagram of a voltage raising module in an embodiment of the present disclosure.

Referring to FIG. 2, in an exemplary embodiment of the present disclosure, a voltage raising module 11 may include: a positive temperature coefficient element 111 and a negative temperature coefficient element 112.

The positive temperature coefficient element 111 is configured to generate a first voltage V1 with a positive temperature coefficient.

The negative temperature coefficient element 112 is configured to generate a second voltage V2 with a negative temperature coefficient.

The first voltage V1 generated by the positive temperature coefficient element 111 and the second voltage V2 generated by the negative temperature coefficient element 112 are combined to form a reference voltage Vz. In the embodiments of the present disclosure, when the positive temperature coefficient element 111 and the negative temperature coefficient element 112 are disposed, it is necessary to ensure that the change of the first voltage V1 caused by the temperature influence and the change of the second voltage V2 caused by the temperature influence can be exactly cancelled out.

In an embodiment, a combination mode of the first voltage V1 and the second voltage V2 may be a weighted sum. When the absolute value of the positive temperature coefficient is equal to the absolute value of the negative temperature coefficient, the weight of the first voltage V1 may be equal to the weight of the second voltage V2, that is, Vz=V1+V2. In other embodiments of the present disclosure, the combination mode of the first voltage V1 and the second voltage V2 may also be subtraction, product or other modes, which is not particularly limited in the present disclosure.

Since the changes of the first voltage V1 and the second voltage V2 caused by the temperature influence can be exactly cancelled out, the reference voltage Vz maintains stable without being influenced by the temperature change.

Figure 3A:
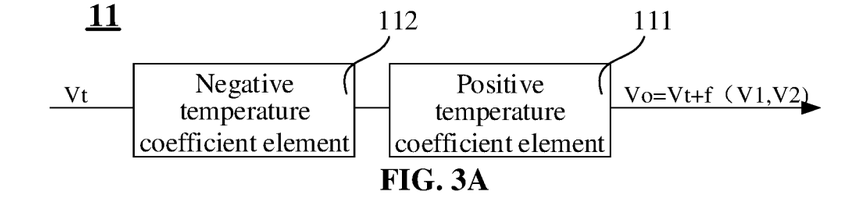
FIG. 3A and FIG. 3B are schematic diagrams of connection modes of a positive temperature coefficient element and a negative temperature coefficient element in the embodiments of the present disclosure.
Figure 3B:
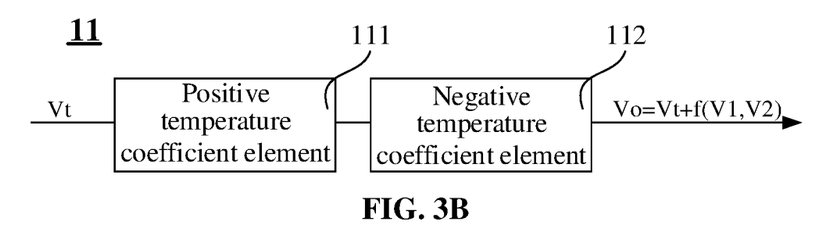

FIG. 3A and FIG. 3B are schematic diagrams of connection modes of a positive temperature coefficient element and a negative temperature coefficient element in the embodiments of the present disclosure.

Referring to FIG. 3A and FIG. 3B, in some embodiments, a first terminal of a negative temperature coefficient element 112 is connected to the voltage Vt to be measured, a second terminal of the negative temperature coefficient element 112 is connected with a first terminal of a positive temperature coefficient element 111, and a second terminal of the positive temperature coefficient element 111 outputs the adjusted voltage Vo, as shown in FIG. 3A. In some other embodiments, the first terminal of the positive temperature coefficient element 111 is connected to the voltage Vt to be measured, the second terminal of the positive temperature coefficient element 111 is connected with the first terminal of the negative temperature coefficient element 112, and the second terminal of the negative temperature coefficient element 112 outputs the adjusted voltage Vo, as shown in FIG. 3B. The f(V1,V2) in FIG. 3A and FIG. 3B represents the combined voltage formed by V1 and V2 in a variety of modes, that is, the reference voltage Vz mentioned above.

Figure 4A:
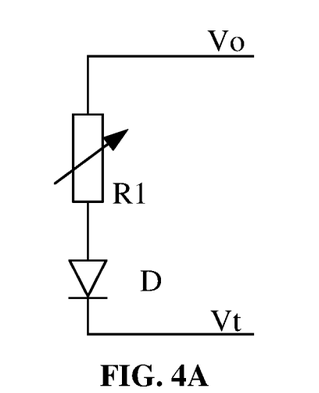
FIG. 4A to FIG. 4C are schematic diagrams of circuit embodiments of a positive temperature coefficient element and a negative temperature coefficient element in the embodiments of the present disclosure.
Figure 4B:
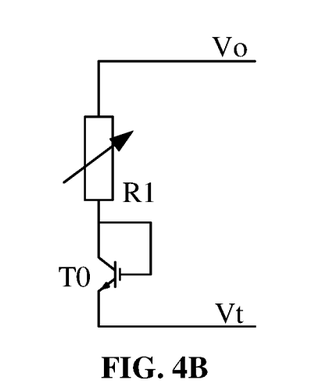
Figures 4C, 5:
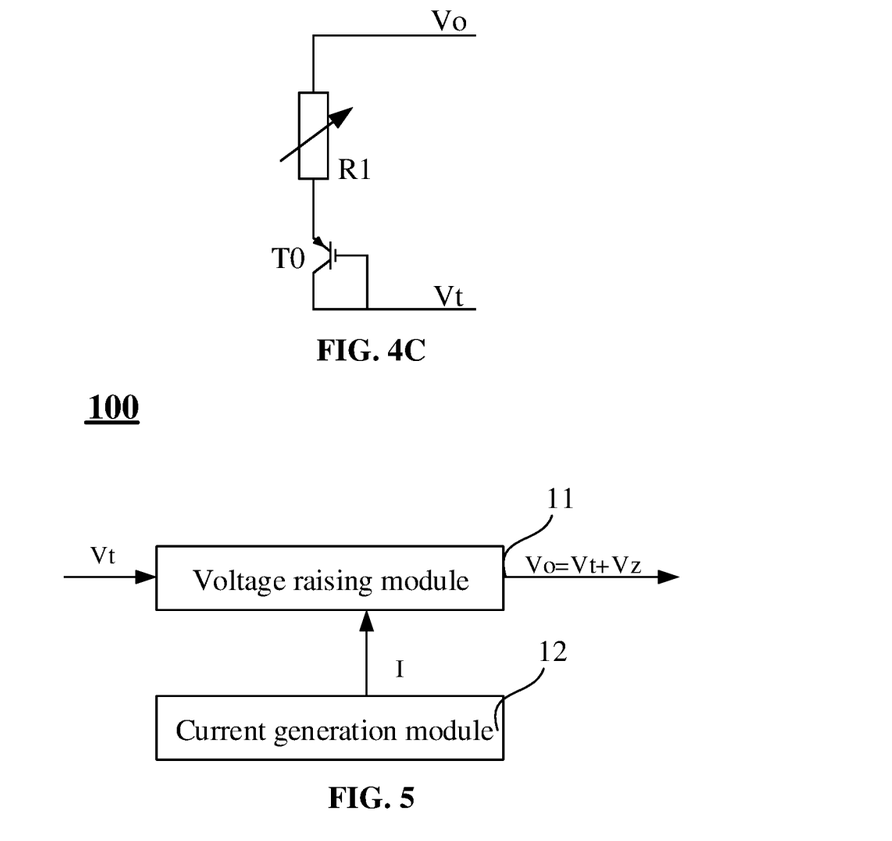
FIG. 5 is a schematic structural diagram of a voltage detection circuit in another embodiment of the present disclosure.

FIG. 4A to FIG. 4C are schematic diagrams of circuit embodiments of a positive temperature coefficient element and a negative temperature coefficient element in the embodiments of the present disclosure.

Referring to FIG. 4A, in an embodiment, the positive temperature coefficient element may be a second resistor R1, and the negative temperature coefficient element may be a diode D. A negative electrode of the diode D is connected to the voltage Vt to be measured, a positive electrode of the diode D is connected with a first terminal of the second resistor R1, and a second terminal of the second resistor R1 outputs the adjusted voltage Vo.

In other embodiments, the positive temperature coefficient element may be a second resistor R1, and the negative temperature coefficient element may be an emitter junction of a bipolar transistor.

Referring to FIG. 4B, when a bipolar transistor T0 is an NPN-type transistor, an emitter of the T0 is connected to the voltage Vt to be measured, and a collector and a base of the T0 are connected with the first terminal of the second resistor R1.

Referring to FIG. 4C, when a bipolar transistor T0 is a PNP-type transistor, an emitter of the T0 is connected with the first terminal of the second resistor R1, and a collector and a base of the T0 are connected to the voltage Vt to be measured.

In the embodiments shown in FIG. 4A to FIG. 4C, the second resistor R1 may be an adjustable resistor to overcome the error caused by the influence of the manufacturing process on the second resistor R1.

FIG. 5 is a schematic structural diagram of a voltage detection circuit in another embodiment of the present disclosure.

Referring to FIG. 5, in an embodiment, the voltage detection circuit 100 may also include: a current generation module 12.

The current generation module 12 is connected to the voltage raising module 11 and configured to provide a constant current I to the voltage raising module 11.

Figure 6:
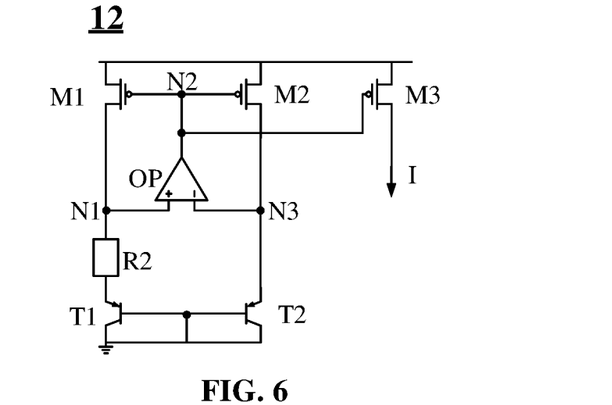
FIG. 6 is a schematic circuit diagram of a current generation module shown in FIG. 5 in an embodiment of the present disclosure.

FIG. 6 is a schematic circuit diagram of a current generation module shown in FIG. 5 in an embodiment of the present disclosure.

Referring to FIG. 6, in an embodiment, the current generation module 12 may include:

a first switch transistor M1 having a first terminal connected to a power supply voltage, a second terminal connected with a first node N1, and a control terminal connected with a second node N2;

a second switch transistor M2 having a first terminal connected to the power supply voltage, a second terminal connected with a third node N3, and a control terminal connected with the second node N2;

a third switch transistor M3 having a first terminal connected to the power supply voltage, a control terminal connected with the second node N2, and a second terminal configured to output the constant current I;

a first bipolar transistor T1 having an emitter connected to the first node N1 through a first resistor R2, and a collector and a base that are grounded;

a second bipolar transistor T2 having an emitter connected with the third node N3, and a collector and a base that are grounded; and an amplifier OP having a non-inverting input terminal connected with the first node N1, an inverting input terminal connected with the third node N3, and an output terminal connected with the second node N2.

In the embodiment shown in FIG. 6, the first switch transistor M1, the second switch transistor M2 and the third switch transistor are all P-type transistors, and the first bipolar transistor T1 and the second bipolar transistor T2 are both PNP-type triodes. In other embodiments, each of the switch transistors and triodes may also be of other types.

The second terminal of the third switch transistor M3 is configured to connect to the voltage raising module 11.

Figure 7A:
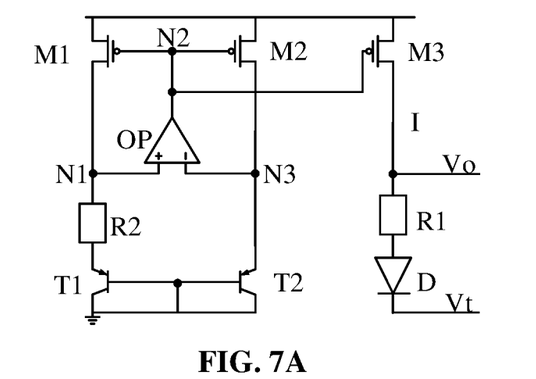
FIG. 7A to FIG. 7C are schematic circuit diagrams of a voltage detection circuit in the embodiments of the present disclosure.
Figure 7B:
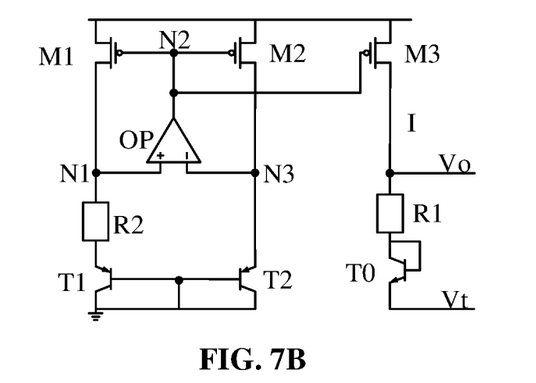
Figure 7C:
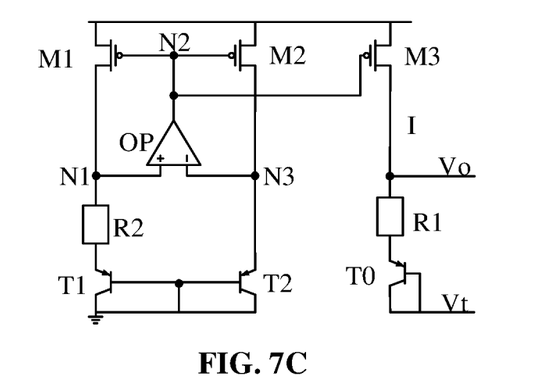

FIG. 7A to FIG. 7C are schematic circuit diagrams of a voltage detection circuit in the embodiments of the present disclosure.

FIG. 7A corresponds to FIG. 4A. Referring to FIG. 7A, when the current generation module 12 outputs the constant current I to the voltage raising module 11, the second terminal of the third switch transistor M3 is connected with the second terminal of the second resistor R1. At this time, the second resistor R1 and the diode D are influenced by the constant current I to respectively generate divided voltages V1 and V2, so that the voltage Vo of the second terminal of the second resistor R1 is Vo=Vt+V1+V2, and at this time, Vz=V1+V2.

FIG. 7B corresponds to FIG. 4B. Referring to FIG. 7B, when the negative temperature coefficient element is an NPN-type transistor T0, since a base and a collector of the T0 are short-circuited to the first terminal of the R1, at this time, the T0 is equivalent to a diode having a positive electrode connected with the first terminal of the R1 and a negative electrode grounded. The diode is influenced by the constant current I to also generate a divided voltage V2, so that the voltage Vo of the second terminal of the second resistor R1 is Vo=Vt+V1+V2, and at this time, Vz=V1+V2.

FIG. 7C corresponds to FIG. 4C. Referring to FIG. 7C, when the negative temperature coefficient element is a PNP-type transistor T0, since a base and a collector of the T0 are short-circuited to the ground, at this time, the T0 is equivalent to a diode having a positive electrode connected with the first terminal of the R1 and a negative electrode grounded. The diode is influenced by the constant current I to also generate a divided voltage V2, so that the voltage Vo of the second terminal of the second resistor R1 is equal to Vt+V1+V2, and at this time, Vz=V1+V2.

Figure 8:
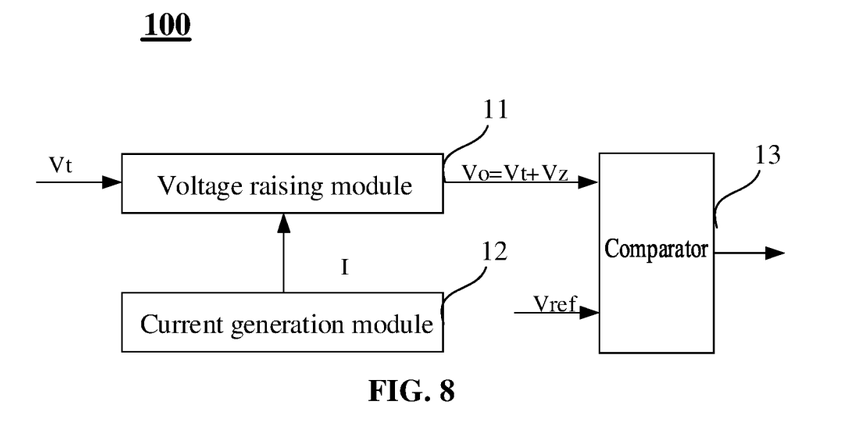
FIG. 8 is a schematic diagram of a voltage detection circuit in another embodiment of the present disclosure.

FIG. 8 is a schematic diagram of a voltage detection circuit in another embodiment of the present disclosure.

Referring to FIG. 8, in an embodiment, the voltage detection circuit 100 may also include a comparator 13. A first input terminal of the comparator 13 is connected to a reference voltage Vref, a second terminal of the comparator 13 is connected to an adjusted voltage Vo, and the comparator 13 is configured to output a comparison result of the adjusted voltage Vo and the reference voltage Vref.

Figure 9:
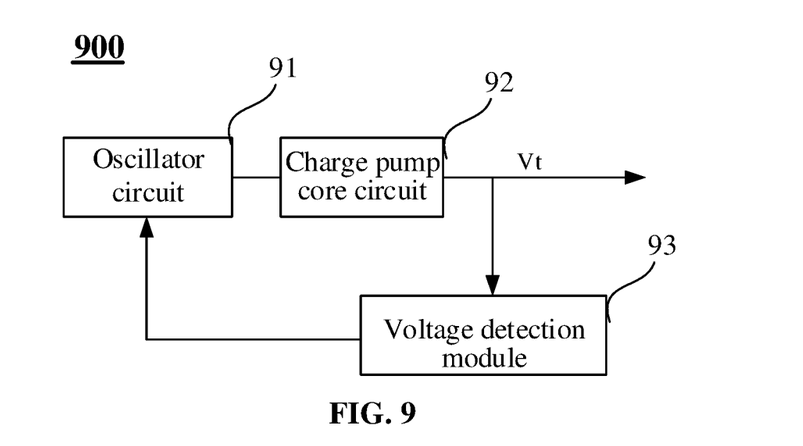
FIG. 9 is a schematic diagram of a charge pump circuit in an exemplary embodiment of the present disclosure.

FIG. 9 is a schematic diagram of a charge pump circuit in an exemplary embodiment of the present disclosure.

Referring to FIG. 9, a charge pump circuit 900 includes:
an oscillator circuit 91 configured to generate an oscillator signal;
a charge pump core circuit 92 configured to raise the oscillator signal to output the voltage Vt to be measured; and
a voltage detection module 93 configured to receive and detect the voltage Vt to be measured, so as to control the operation of the oscillator circuit 91 according to a detection result.

The voltage detection module 93 includes the voltage detection circuit 100 described in any one of the above embodiments.

In the embodiments of the present disclosure, a reference voltage is generated by using a first voltage with a positive temperature coefficient and a second voltage with a negative temperature coefficient, and the reference voltage is used to raise the voltage to be measured, so that the voltage to be measured can be raised without being influenced by the temperature change to facilitate detection, so as to improve the negative voltage detection accuracy.

It should be noted that although several modules or units of the equipment for action execution are mentioned in the above detailed description, this division is not mandatory. In fact, according to the embodiments of the present disclosure, the features and functions of two or more modules or units described above may be embodied in one module or unit. Conversely, the features and functions of one module or unit described above may be further embodied by a plurality of modules or units.

After considering the specification and implementing the disclosure disclosed here, other implementation solutions of the present disclosure would readily be conceivable to a person skilled in the art. This application is intended to cover any variations, uses, or adaptations of the present disclosure following the general principles thereof and including such departures from the present disclosure as come within known or customary practice in the art. The specification and embodiments are only regarded as exemplary, and the true scope and concept of the present disclosure are indicated by the claims.

INDUSTRIAL APPLICABILITY

In the embodiments of the present disclosure, a reference voltage is generated by using a first voltage with a positive temperature coefficient and a second voltage with a negative temperature coefficient, and the reference voltage is used to raise the voltage to be measured, so that the voltage to be measured can be raised without being influenced by the temperature change to facilitate detection, so as to improve the negative voltage detection accuracy.

The invention claimed is:

1. A voltage detection circuit, comprising:
a voltage raising circuit configured to adjust a voltage to be measured and output an adjusted voltage, wherein the adjusted voltage is equal to a sum of the voltage to be measured and a reference voltage; and
a current generation circuit connected to the voltage raising circuit and configured to provide a constant current to the voltage raising circuit,
wherein the reference voltage is generated by a combination of a first voltage with a positive temperature coefficient and a second voltage with a negative temperature coefficient, and
wherein the current generation circuit comprises:
a first switch transistor having a first terminal connected to a power supply voltage, a second terminal connected with a first node, and a control terminal connected with a second node;
a second switch transistor having a first terminal connected to the power supply voltage, a second terminal connected with a third node, and a control terminal connected with the second node;
a third switch transistor having a first terminal connected to the power supply voltage, a control terminal connected with the second node, and a second terminal configured to output the constant current;
a first bipolar transistor having an emitter connected with the first node through a first resistor, and a collector and a base that are grounded;
a second bipolar transistor having an emitter connected with the third node, and a collector and a base that are grounded; and
an amplifier having a non-inverting input terminal connected with the first node, an inverting input terminal connected with the third node, and an output terminal connected with the second node.

2. The voltage detection circuit of claim 1, wherein the voltage raising circuit comprises:
a positive temperature coefficient element configured to generate the first voltage; and
a negative temperature coefficient element configured to generate the second voltage.

3. The voltage detection circuit of claim 2, wherein an absolute value of the positive temperature coefficient is equal to an absolute value of the negative temperature coefficient.

4. The voltage detection circuit of claim 2, wherein the positive temperature coefficient element is a second resistor, and the negative temperature coefficient element is an emitter junction of a diode or a bipolar transistor.

5. The voltage detection circuit of claim 4, wherein the second resistor is an adjustable resistor.

6. The voltage detection circuit of claim 2, wherein a first terminal of the negative temperature coefficient element is connected to the voltage to be measured, a second terminal of the negative temperature coefficient element is connected with a first terminal of the positive temperature coefficient element, and a second terminal of the positive temperature coefficient element outputs the adjusted voltage.

7. The voltage detection circuit of claim 2, wherein a first terminal of the positive temperature coefficient element is connected to the voltage to be measured, a second terminal of the positive temperature coefficient element is connected with a first terminal of the negative temperature coefficient element, and a second terminal of the negative temperature coefficient element outputs the adjusted voltage.

8. The voltage detection circuit of claim 1, wherein an absolute value of the positive temperature coefficient is equal to an absolute value of the negative temperature coefficient.

9. The voltage detection circuit of claim 1, wherein the first switch transistor, the second switch transistor and the third switch transistor are all P-type transistors, and the first bipolar transistor and the second bipolar transistor are both PNP-type triodes.

10. The voltage detection circuit of claim 1, wherein the voltage to be measured is a negative voltage.

11. The voltage detection circuit of claim 1, further comprising:
a comparator having a first terminal connected to a reference voltage for the comparator, and a second terminal connected to the adjusted voltage.

12. A charge pump circuit, comprising: a voltage detection circuit, wherein
the voltage detection circuit comprises:
a voltage raising circuit configured to adjust a voltage to be measured and output an adjusted voltage, wherein the adjusted voltage is equal to a sum of the voltage to be measured and a reference voltage; and
a current generation circuit connected to the voltage raising circuit and configured to provide a constant current to the voltage raising circuit,
wherein the reference voltage is generated by a combination of a first voltage with a positive temperature coefficient and a second voltage with a negative temperature coefficient, and
wherein the current generation circuit comprises:
a first switch transistor having a first terminal connected to a power supply voltage, a second terminal connected with a first node, and a control terminal connected with a second node;

a second switch transistor having a first terminal connected to the power supply voltage, a second terminal connected with a third node, and a control terminal connected with the second node;

a third switch transistor having a first terminal connected to the power supply voltage, a control terminal connected with the second node, and a second terminal configured to output the constant current;

a first bipolar transistor having an emitter connected with the first node through a first resistor, and a collector and a base that are grounded;

a second bipolar transistor having an emitter connected with the third node, and a collector and a base that are grounded; and an amplifier having a non-inverting input terminal connected with the first node, an inverting input terminal connected with the third node, and an output terminal connected with the second node.

13. The charge pump circuit of claim 12, further comprising:

an oscillator circuit configured to generate an oscillator signal; and a charge pump core circuit configured to raise the oscillator signal to output the voltage to be measured.

14. The charge pump circuit of claim 12, wherein the voltage raising circuit comprises:

a positive temperature coefficient element configured to generate the first voltage; and a negative temperature coefficient element configured to generate the second voltage.

15. The charge pump circuit of claim 14, wherein the positive temperature coefficient element is a second resistor, and the negative temperature coefficient element is an emitter junction of a diode or a bipolar transistor.

16. The charge pump circuit of claim 14, wherein a first terminal of the negative temperature coefficient element is connected to the voltage to be measured, a second terminal of the negative temperature coefficient element is connected with a first terminal of the positive temperature coefficient element, and a second terminal of the positive temperature coefficient element outputs the adjusted voltage.

17. The charge pump circuit of claim 14, wherein a first terminal of the positive temperature coefficient element is connected to the voltage to be measured, a second terminal of the positive temperature coefficient element is connected with a first terminal of the negative temperature coefficient element, and a second terminal of the negative temperature coefficient element outputs the adjusted voltage.

18. The charge pump circuit of claim 12, wherein an absolute value of the positive temperature coefficient is equal to an absolute value of the negative temperature coefficient.

* * * * *